United States Patent [19]

Matsushita et al.

[11] Patent Number: 5,102,819
[45] Date of Patent: Apr. 7, 1992

[54] METHOD OF MAKING A DRAM CELL

[75] Inventors: Takeshi Matsushita; Muneharu Shimanoe; Hiroshi Sato; Akira Nieda, all of Kanagawa, Japan

[73] Assignee: Sony Corporation, Tokyo, Japan

[21] Appl. No.: 644,448

[22] Filed: Jan. 23, 1991

Related U.S. Application Data

[62] Division of Ser. No. 397,744, Aug. 23, 1989.

[30] Foreign Application Priority Data

Aug. 25, 1988 [JP] Japan ............... 63-212159

[51] Int. Cl.$^5$ ............... H01L 21/70
[52] U.S. Cl. ............... 437/52; 437/47; 437/48; 437/60; 437/62; 437/86; 437/191; 437/919
[58] Field of Search ............... 437/47, 48, 49, 51, 437/52, 60, 62, 83, 84, 86, 191, 193, 195, 200, 225, 228, 919; 357/23.6, 51

[56] References Cited

U.S. PATENT DOCUMENTS

| | | | |
|---|---|---|---|
| 4,800,527 | 1/1989 | Ozaki et al. | 365/182 |
| 4,855,952 | 8/1989 | Kiyosumi | 357/23.6 |
| 4,907,047 | 3/1990 | Kato et al. | 357/23.6 |
| 4,937,641 | 6/1990 | Sunami et al. | 357/23.6 |

FOREIGN PATENT DOCUMENTS

| | | |
|---|---|---|
| 0207055 | 9/1986 | Japan . |
| 0049649 | 3/1987 | Japan . |
| 0037649 | 2/1988 | Japan . |

Primary Examiner—Brian E. Hearn
Assistant Examiner—Tom Thomas
Attorney, Agent, or Firm—Hill, Van Santen, Steadman & Simpson

[57] ABSTRACT

A semiconductor memory having storage cells each consisting of a MIS transistor and a capacitor, and a method of manufacturing the same. The semiconductor memory comprises a semiconductor substrate, an insulating layer formed on the semiconductor substrate, and semiconductor regions formed on the surface of the insulating layer. The semiconductor memory is characterized in that the MIS transistors are formed, respectively, on the surfaces of the semiconductor regions and separated from each other and from the semiconductor substrate by an insulating layer, and the capacitors are formed, respectively, under the corresponding MIS transistors. The insulating layer separating the MIS transistors from each other and from the semiconductor substrate reduces current leakage between the storage cells and reduces capacitance across bit lines formed on the side of the MIS transistors and the semiconductor substrate. The method of manufacturing the semiconductor memory includes a lapping process for lapping the surface of a wafer in forming the semiconductor regions in recesses formed by the insulating layer. The lapping process uses an alkaline liquid as a lapping liquid and employs a lapping disk provided with a hard lapping pad to finish the surfaces of the semiconductor regions flush with the surface of the insulating layer by lapping.

2 Claims, 18 Drawing Sheets (Pior Art)

0
METHOD OF MAKING A DRAM CELL

This is a division of application Ser. No. 397,744, filed Aug. 23, 1989.

BACKGROUND OF THE INVENTION

1. Field of the Invention

The present invention relates to a semiconductor memory and a method of manufacturing the same and, more particularly, to a semiconductor memory comprising storage cells each of a combination of a MIS transistor and a capacitor and a method of manufacturing the same.

2. Description of the Prior Art

The dynamic RAM comprising storage cells each of a combination of a data storage capacitor and an access transistor has the highest possibility of being constructed in a high degree of integration among semiconductor memories and is employed in various electronic apparatus. Energetic activities for the technological development of dynamic RAMs have been extensively conducted. Some results of the technological development of dynamic RAMs are disclosed, for example, in J.P. Pub. Nos. 60-1952 and 60-19597.

As is described in "Trend of 4M and 16M DRAMs; Multilayer Capacitor and Trench Capacitor", Monthly Semiconductor World, pp. 31–36, Feb. 1988, dynamic RAMs are classified roughly into those of a multilayer capacitor type employing multilayer capacitors formed on a semiconductor substrate and those of a trench capacitor type employing trench capacitors formed on a semiconductor substrate. Most noticeable at the present as a RAM having the highest possibility of high-density integration is a static RAM of a trench capacitor type comprising trench capacitors formed in trenches formed in a semiconductor substrate, and access transistors formed directly above the trench capacitors. The construction of such a static RAM is illustrated in a sectional view in page 36 of the foregoing monthly magazine.

Efforts have been made to develop a method of fabricating a VLSI (very large scale integrated circuit) incorporating the foregoing semiconductor memories by using a so-called SOI (silicon-on-insulator) substrate formed by forming a thin single crystal silicon film over an insulative body. A SOI substrate is considered to be most excellent in crystallinity and characteristics among various SOI substrates.

In fabricating a SOI substrate through a process shown in FIGS. 16A, 16B and 16C, it is essential to lap a silicon wafer 101 selectively after applying a silicon wafer 105 to the silicon wafer 101 to finish the surfaces of insular silicon layers 106 formed in recesses formed by a SiO$_2$ film flat and flush with the surface 103a of the SiO$_2$ film 103 surrounding the insular silicon layers 106 without damaging. Various lapping methods have been proposed for such a purpose.

FIG. 17 shows a lapping apparatus for selective lapping. A laminated wafer 108 formed by laminating the silicon wafers 101 and 105 as shown in FIG. 16B is attached to a wafer holder 109, for example, with a wax. An abrasive disk 112 is formed by applying an abrasive pad 111 to the surface of a lapping disk 110. The abrasive disk 112 is rotated and a lapping liquid 114 is supplied to the surface of the abrasive pad 111 with the surface of the laminated wafer 108 to be lapped in contact with the abrasive pad 111 to lap the wafer 108. The lapping liquid 114 is an alkaline solution or an alkaline solution containing abrasive grains, which reacts on silicon and does not react on SiO$_2$. The abrasive pad 111 is a very hard disk 116 as shown in FIG. 18, such as a ceramic disk or a carbide disk, a suede-finished soft urethane form cloth 117 as shown in FIG. 19.

J.P. Provisional Pub. (Kokai) No. 62-259769 discloses a lapping method of finishing the surface of a silicon wafer in a high flatness, which employs a polyurethane abrasive cloth and an amine solution as a lapping liquid for lapping. This known lapping method, however, refers to nothing about selective lapping for finishing a surface including both an insulative material and silicon in a flat surface by lapping.

Incidentally, in the static RAM of a trench capacitor type comprising storage cells each consisting of a trench capacitor and an access transistor formed directly above the trench capacitor, the n-type source-drain region (a region on the side of the capacitor) of a MIS access transistor is formed in a p$^-$ layer formed on a p$^+$-type semiconductor substrate by epitaxial growth. Therefore, it is possible that a depletion layer extending from the n-type region into the p-type epitaxial layer of a storage cell encounters with a depletion layer extending from the n-type source-drain region (a region on the side of the capacitor) of the adjacent storage cell when the storage cell are formed in a high density. Accordingly, this static RAM has an electrical disadvantage that current leakage increases even though the static RAM can be formed in a minute construction, and hence it is impossible to arrange the storage cells in a sufficiently high density.

Furthermore, since most conventional semiconductor memories are of a bulk silicon MOS type, it is difficult to reduce the parasitic capacitance across the bit line and the substrate. Accordingly, the open-bit construction, though excellent in integrating capability, is inferior in noise resistance and hence the open-bit construction is subject to limitation in the degree of integration. The semiconductor memory of a trench capacitor type is inevitably susceptible to soft errors and has a disadvantage that an optional bias voltage, for example, 0.5 V$_{cc}$, cannot be applied to the plate.

SUMMARY OF THE INVENTION

Accordingly, it is an object of the present invention to provide a semiconductor memory comprising: a semiconductor substrate of a SOI construction; storage cells formed on the semiconductor substrate so that current leakage therebetween is reduced and each consisting of a MIS transistor and a capacitor; and bit lines reducing the capacitance across the bit lines and the substrate; hardly subject to soft errors, and enabling the setting of the electrode potential of the capacitors at an optional plate potential.

It is another object of the present invention to provide a method of manufacturing a semiconductor memory, including a lapping process for lapping a semiconductor layer formed on an insulating layer having recesses arranged in a pattern so that the surfaces of insular semiconductor layers remaining in the recesses of the insulating layer are flush with the surface of the insulating layer.

In one aspect of the present invention, a semiconductor memory comprises: a semiconductor substrate of a SOI construction; and storage cells formed on the semiconductor substrate and each consisting of a MIS transistor and a capacitor; and is characterized in that a semiconductor region in which the MIS transistor is formed is disposed in the surface of an insulating layer formed on the semiconductor substrate, the capacitor using the semiconductor substrate as one of the electrodes thereof is formed under the MIS transistor, and the other electrode formed opposite the former electrode with a dielectric film therebetween is connected through contact holes formed in the insulating layer to the MIS transistor formed in the semiconductor region.

In another aspect of the present invention, a method of manufacturing a semiconductor memory includes a lapping process for lapping a semiconductor layer formed on an insulating layer having recesses arranged in a pattern so that the surfaces of insular semiconductor layers remaining in the recesses of the insulating layer are flush with the surface of the insulating layer, and is characterized in that an alkaline solution is used as a lapping liquid in lapping the semiconductor layer, and the ratio of lapping rate for lapping portions of the semiconductor layer corresponding to portions of the insulating layer other than those forming the recesses to lapping rate for lapping portions of the semiconductor layer corresponding to the portions of the insulating layer forming the recesses (hereinafter referred to as "lapping rate ratio") is not less than twenty, preferably not less than fifty.

The lapping rate ratio is regulated by regulating lapping liquid supply rate and pressure applied to a hard pad having a hardness in the range of 75 to 95.

The separation of the MIS transistors from each other by the insulating layer formed on the semiconductor substrate of a SOI construction reduces current leakage between the storage cells remarkably. The use of the semiconductor substrate of a SOI construction and the insulating layer formed between the MIS transistors and the semiconductor substrate reduces the capacitance across the bit lines formed on the side of the MIS transistors and the semiconductor substrate. Accordingly, the semiconductor memory is resistant to noise and hence can be formed in an open bit construction having excellent integrating characteristics. Thus, the semiconductor memory of the present invention can be formed in a high degree of integration.

The insulating layer formed over the surface of the semiconductor substrate on which the capacitors are formed intercepts alpha rays and hence the semiconductor memory is highly resistant to soft errors.

Furthermore, since the semiconductor substrate is independent and is connected electrically to none of the rest of the components of the semiconductor memory, the semiconductor substrate can be set at an optional bias potential, for example, the half of $V_{cc}$, which enables the reduction of the voltage applied to the dielectric film.

Still further, the semiconductor memory of the present invention can be formed in a high degree of integration because the capacitors are formed under the access MIS transistors.

In lapping the semiconductor layer by the lapping process included in the method of manufacturing a semiconductor memory in accordance with the present invention, the alkaline solution and the semiconductor layer interacts to form a film of a reaction product for reactive lapping. The film of reaction product is wiped off mechanically by the hard pad for reactive lapping. The formation of a film of the reaction product and the removal of the same are repeated alternately to lap the semiconductor layer. The alkaline solution does not react on the insulating layer. Since the lapping rate ratio is not less than twenty and the insulating layer is not lapped by reactive lapping, only the portions of the semiconductor layer remaining on the portions of the insulating layer other than those forming the recesses are lapped positively in the final stage of the lapping process, so that insular semiconductor layers having surfaces flush with the surface of the insulating layer are formed in the recesses.

Furthermore, since only the alkaline solution is used as a lapping liquid and the hard pad of a hardness in the range of 75 to 95 is used for lapping, the insular semiconductor layers are finished flush with the surface of the insulating layer without being damaged.

BRIEF DESCRIPTION OF THE DRAWINGS

The above and other objects, features and advantages of the present invention will become more apparent from the following description taken in conjunction with the accompanying drawings in which.

DETAILED DESCRIPTION OF THE PREFERRED EMBODIMENTS

A semiconductor memory in a preferred embodiment according to the present invention will be described hereinafter with reference to FIGS. 1 and 2(A) to 2(K).

Figure 1:
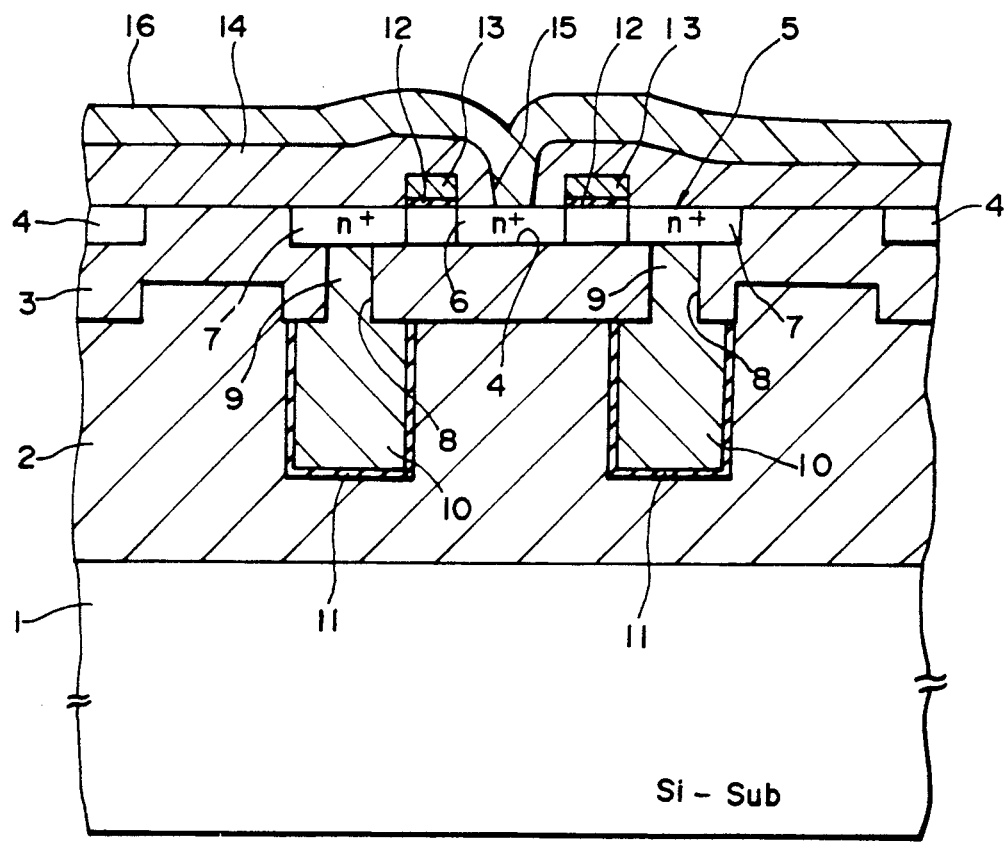
FIG. 1 is a sectional view of a semiconductor memory in a preferred embodiment according to the present invention.

Referring to FIG. 1, there are shown a semiconductor substrate (silicon substrate) 1, a polycrystalline silicon layer 2 formed on the semiconductor substrate 1, an insulating layer (SiO₂ layer) 3 formed over the surface of the polycrystalline silicon layer 2, recesses 4 (only one of them is shown) formed in the surface of the insulating layer 3 in a predetermined pattern by selectively removing portions of the insulating layer 3, and semiconductor regions (silicon regions) 5 (only one of them is shown) formed in the recesses 4. The semiconductor substrate 1, the polycrystalline silicon layer 2, the insulating layer 3 and the semiconductor regions 5 form a SOI structure.

Access MIS transistors having source-drain regions 6 and 7 are formed in the semiconductor region 5. The source-drain region 6 is connected to a bit line, and the source-drain regions 7 are connected to capacitors. Contact holes 8 are formed through the insulating layer 3 and filled with polycrystalline silicon layers 9. Polycrystalline silicon layers 10 are formed under the source-drain regions 7 formed in the surface of the polycrystalline silicon layer 2 and are connected through the polycrystalline silicon layers 9 to the source-drain regions 7, respectively.

Dielectric films 11, such as SiO₂ films, are formed between the polycrystalline silicon layers 10 and the polycrystalline silicon layer 2. Each dielectric film 11 may be a SiO₂/SiN/SiO₂ structure (ONO structure). The semiconductor substrate 1, the polycrystalline silicon layer 2, the dielectric films 11 and the polycrystalline silicon layers 10 form capacitors for information storage. The semiconductor substrate 1 and the polycrystalline silicon layer 2 serve as first electrodes of the semiconductor memory, and the polycrystalline silicon layers 10 serve as second electrodes of the same. The polycrystalline silicon layers 10 serving as the second electrodes are connected electrically through the polycrystalline silicon layers 9 filling the contact holes 8 to the source-drain regions 7 of the MIS transistors.

Also shown in FIG. 1 are oxide films 12 for the gates of the MIS transistors gate electrodes 13 formed, for example, of polycrystalline silicon or polycide, a layer insulating film 14, a contact hole 15 for a bit line formed in the layer insulating film 14, and a bit line 16 formed of aluminum or polycide and connected through the contact hole 15 to the source-drain region 6.

Since the storage cells of the semiconductor memory thus constructed are separated by the insulating layer 3, current leakage between the storage cells, which occurs in the conventional dynamic RAM of trench capacitor type, never occurs.

The SOI structure reduces the capacitance between the bit line 16 and the semiconductor substrate 1 greatly, which enhances the noise resistance and enables the employment of the open bit construction which enables the construction of the semiconductor memory in a high degree of integration.

Furthermore, forming the capacitors on the side of the semiconductor substrate of the SOI construction and shielding the capacitors from alpha rays by the insulating layer enhances the resistance to soft errors.

Still further, since the semiconductor substrate 1 and the polycrystalline silicon layer 2 of the semiconductor memory are isolated electrically from the rest of the components, an optional bias voltage can be applied to the semiconductor substrate 1 and the polycrystalline silicon layer 2. Accordingly, the voltage applied to the dielectric films 11 is reduced by half to improve the S/N ratio and the reliability of the dielectric films 11 by applying the half of a supply voltage $V_{cc}$ to the semiconductor substrate 1 as a plate voltage.

Moreover, forming the capacitors of the semiconductor memory under the access MIS transistors enables high-density integration of the storage cells, and hence the present invention has the potential of forming 16M-bit or 64M-bit static RAMs.

A method of manufacturing a semiconductor memory embodying the present invention will be described hereinafter with reference to FIGS. 2(A) to 2(K) showing the sequential steps of the method.

Figure 2A:
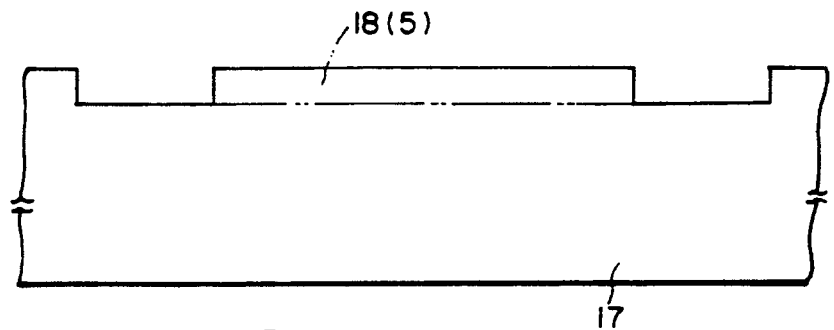
FIGS. 2(A) to 2(K) are sectional views sequentially showing the steps of a method of manufacturing a semiconductor memory embodying the present invention.

Step A: The surface of a first semiconductor substrate (silicon substrate) 17 is etched selectively by a depth, for example, of 0.1 mm to form lands 18 as shown in FIG. 2(A). The first semiconductor substrate 17 and the semiconductor substrate 1 shown in FIG. 1 are separate semiconductor substrates. In the final stage of the semiconductor memory manufacturing process, portions of the first semiconductor substrate 17 other than those forming the lands 18 are removed leaving only the lands 18 as semiconductor regions (FIG. 1) in which MIS transistors are formed.

Figure 2B:
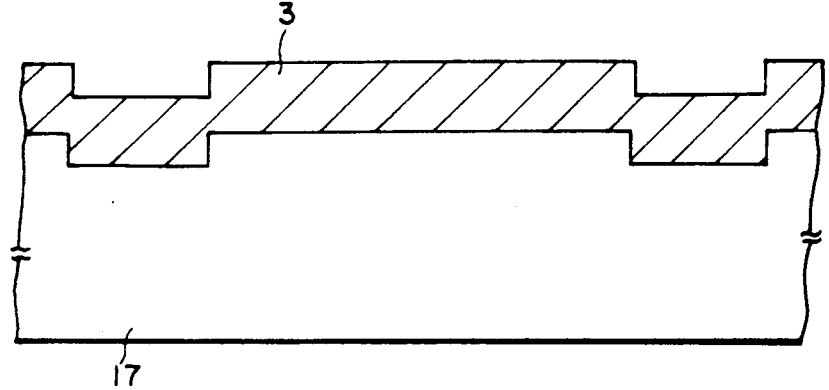

Step B: Then, as shown in FIG. 2(B), an insulating layer 3, namely, a SiO₂ film, is formed over the surface of the first semiconductor substrate 17.

Figure 2C:
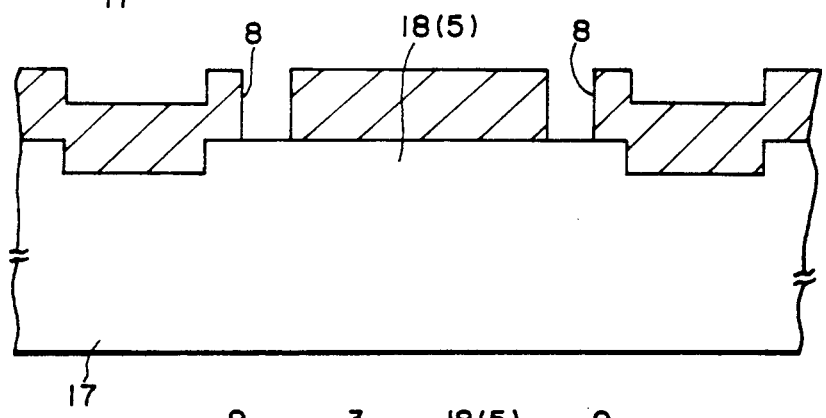

Step C: Then, as shown in FIG. 2(C), the insulating layer 3 is etched selectively to form contact holes 8 reaching the surfaces of the lands 18 corresponding to the backsides of the semiconductor regions 5, at positions in portions in which source-drain regions 7 are to be formed.

Figure 2D:
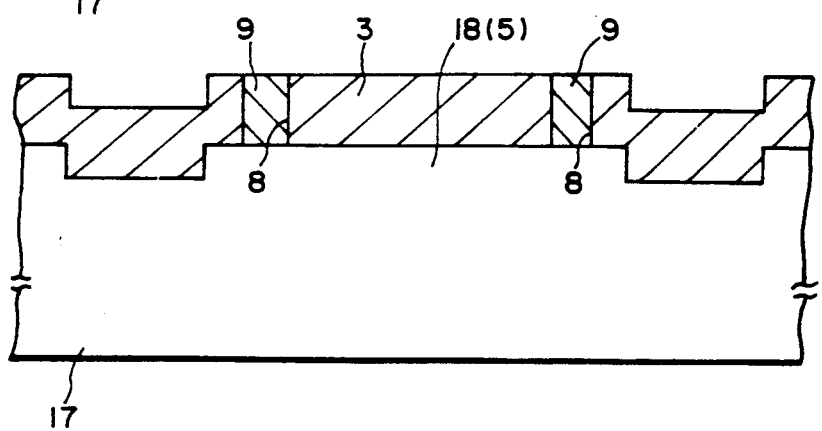

Step D: Then, as shown in FIG. 2(D), the contact holes 8 are filled with polycrystalline silicon layers 9 respectively. In forming the polycrystalline silicon layers 9, polycrystalline silicon is deposited in the contact holes 8 by a CVD process, and then the surface of the deposited polycrystalline silicon is etched to finish the surface of the polycrystalline silicon layers 9 flush with the surface of the insulating layer 3.

Figure 2E:
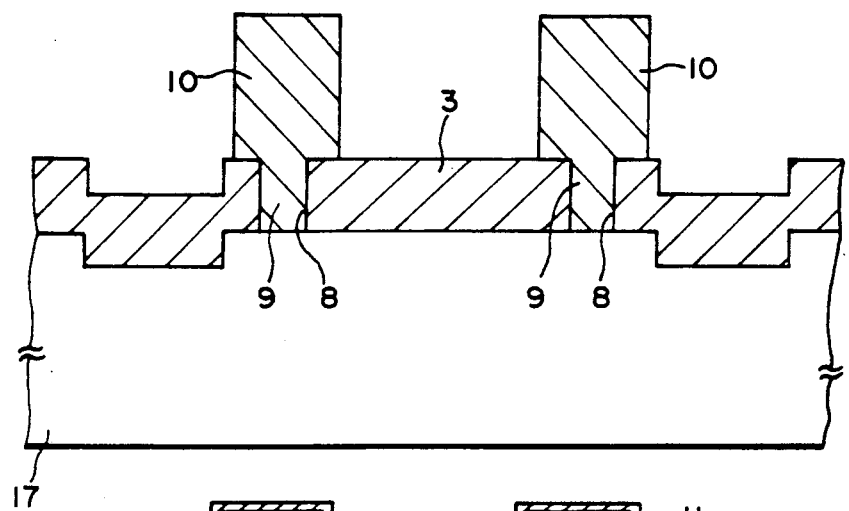

Step E: Then, as shown in FIG. 2(E), polycrystalline silicon layers 10 for the second electrodes of capacitors are formed on the insulating layer 3 at positions corresponding to the surfaces of the polycrystalline silicon layers 9. The polycrystalline layers 10 are formed by photoetching a polycrystalline silicon film of several microns in thickness formed over the insulating layer 3.

Figure 2F:
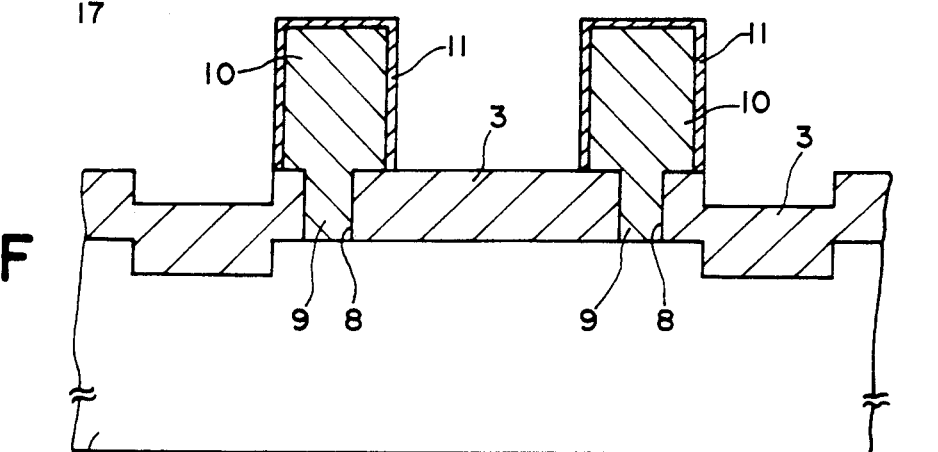

Step F: Then, as shown in FIG. 2(F), the surfaces of the polycrystalline silicon layers 10 are subjected to thermal oxidation to form dielectric films 11, namely, SiO₂ films. The dielectric films 11 may be three-layer SiO₂/SiN/SiO₂ films, which naturally must be formed by a CVD process.

Figure 2G:
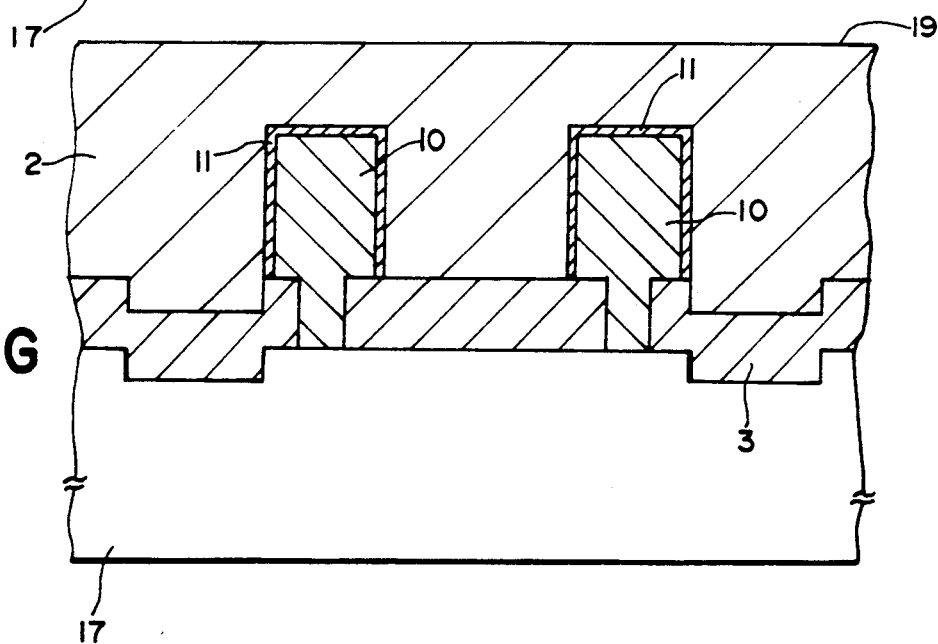

Step G: Then, a polycrystalline silicon layer 2 of a thickness sufficiently greater than that of the polycrystalline silicon layers 10, for example, a thickness in the range of 5 to 10 mm, is formed over the insulating layer 3, and then the surface 19 of the polycrystalline silicon layer 2 is finished in a flat surface by lapping as shown in FIG. 2(G).

Figure 2H:
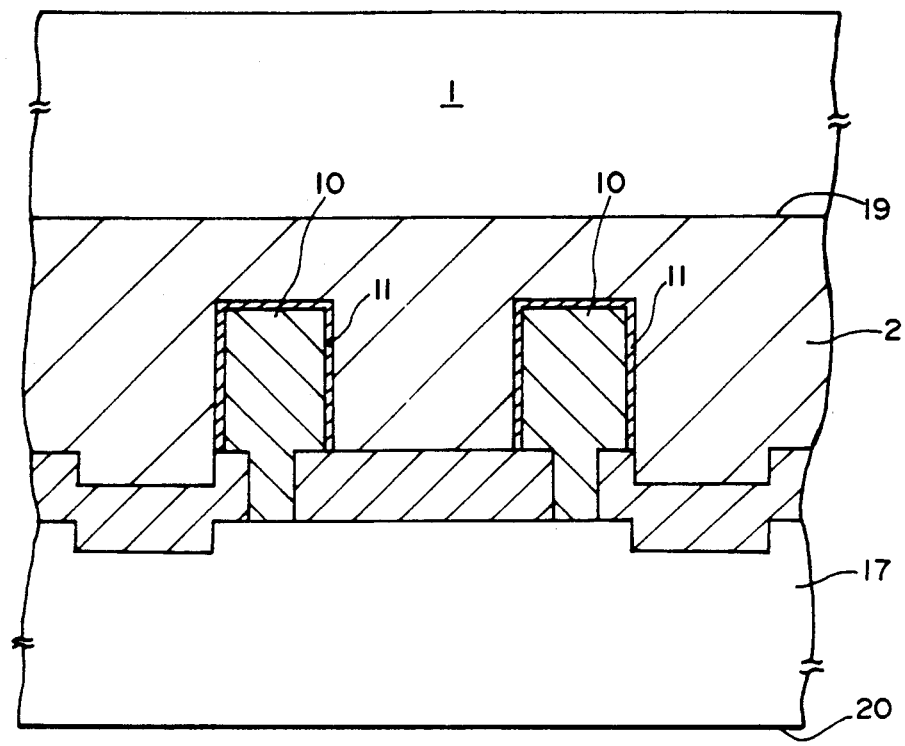

Step H: Then, as shown in FIG. 2(H), a second semiconductor substrate (silicon substrate) 1 is applied to the surface 19 of the polycrystalline silicon layer 2. Indicated at 20 is the backside of the semiconductor substrate 17.

Figure 2I:
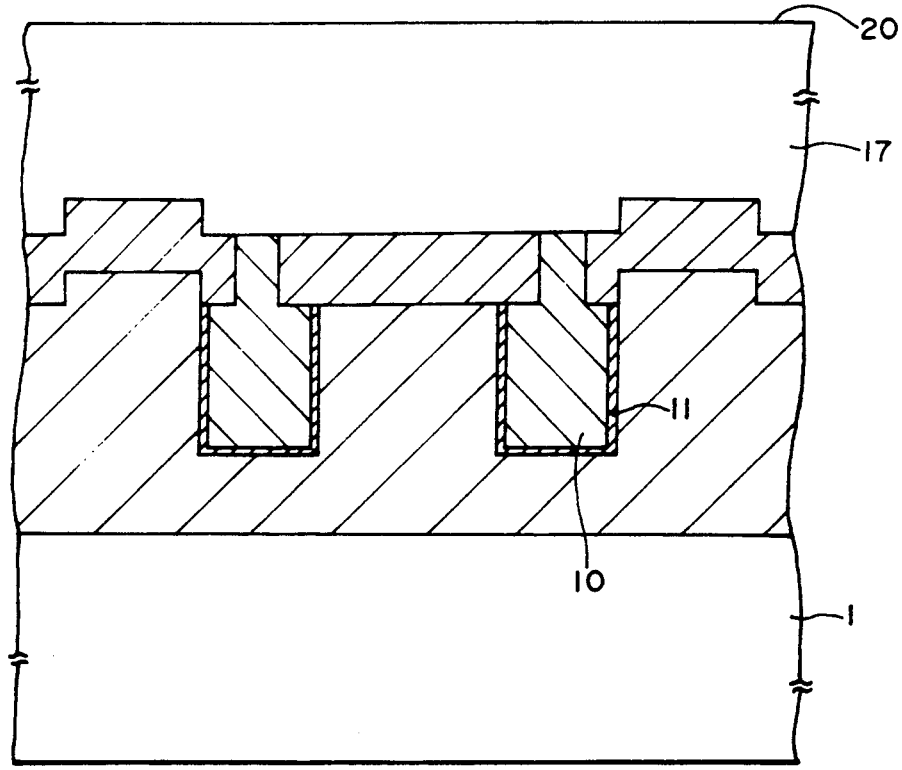

Step I: Then, as shown in FIG. 2(I), the assembly of the semiconductor substrates 1 and 17 is turned over.

Figure 2J:
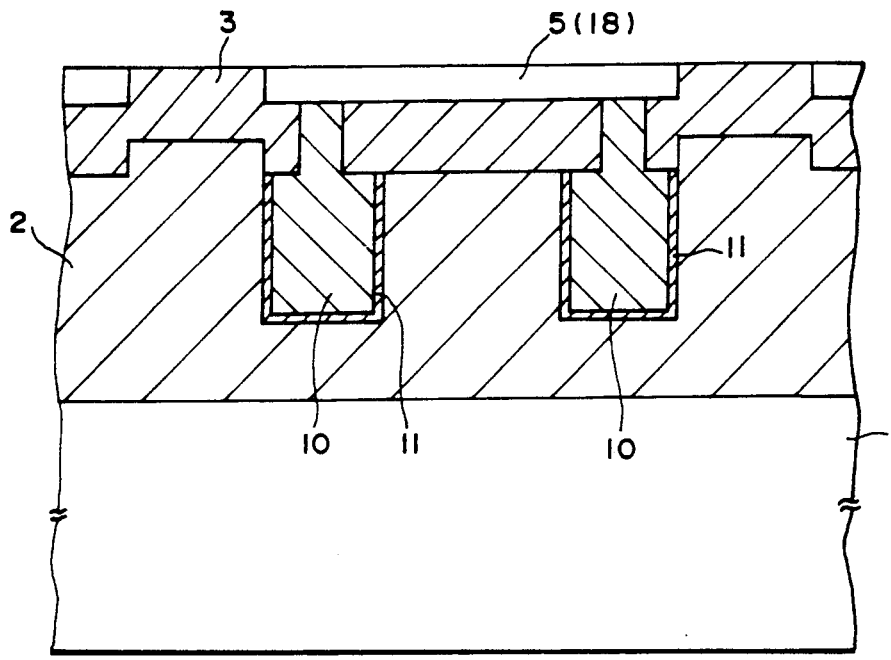

Step J: Then, the backside 20 of the first semiconductor substrate 17 is lapped until the surface of the insulating layer 3 is exposed to leave only the portions of the semiconductor substrate 17 forming the lands 18 as shown in FIG. 2(J). The lands 18 serve as the semiconductor regions 5.

Figure 2K:
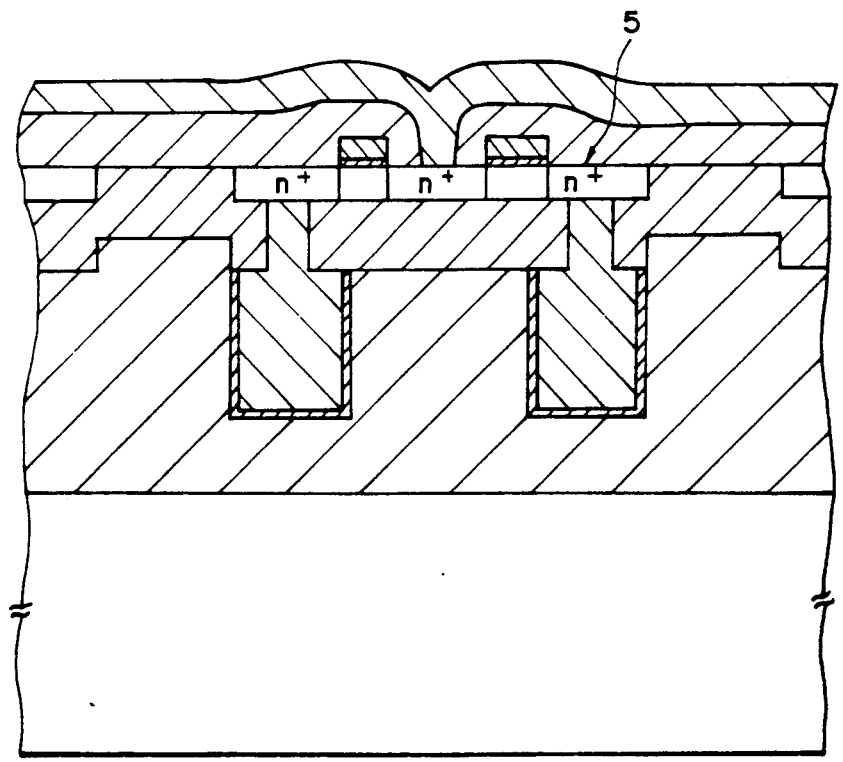

Step K: Finally, as shown in FIG. 2(K), access MIS transistors are formed in the semiconductor regions 5 by a conventional process of forming a SOI transistor to complete a semiconductor memory as shown in FIG. 1.

Step I will be described further with reference to FIGS. 4 to 12.

Figure 9:
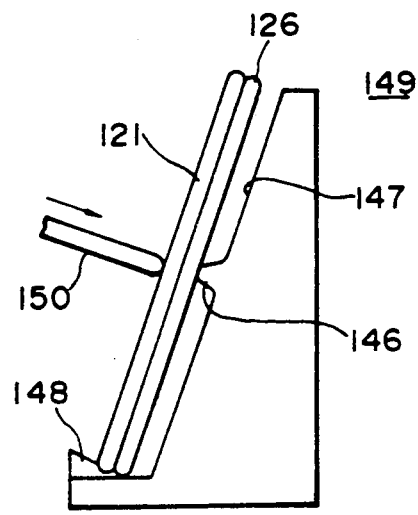

The respective surfaces of wafers 121 and 126 to be joined together are cleaned by a mixed cleaning liquid of ammonia and hydrogen peroxide, and then the wafers 121 and 126 are dried by a dryer. Then, the wafers 121 and 126 are made to adhere spontaneously to each other by hydrogen bonding principally by the agency of hydroxyl groups in a clean atmosphere. The combination of the wafers 121 and 126 is heated in an oxygen or nitrogen atmosphere at 1100° C. for two hours to increase the bonding strength of the interface 128 between the wafers 121 and 126 to a level corresponding to that of the bulk. An assembling jig 145 shown in FIG. 8 or an assembling jig 149 shown in FIG. 9 is used to affix the wafers 121 and 126 to each other. In affixing the wafers 121 and 126 to each other, the wafers 121 and 126 are placed in contact with each other, and then the wafers 121 and 126 are pressed at the respective corresponding central points toward each other. The assembling jig 145 shown in FIG. 8 comprises a block having a V-shaped groove defined by inclined surfaces 141 and 142, and pressing rods 143 and 144 supported on the block for lateral sliding movement to press the corresponding wafers 121 and 126 at the centers thereof. In affixing the wafers 121 and 126 to each other on the assembling jig 145, the wafers 121 and 126 are placed in the V-shaped groove so as to rest on the inclined surfaces 141 and 142, respectively, with the respective orientation flats thereof in contact with the bottom of the V-shaped groove, and then, the wafers 121 and 126 are pressed toward each other with the presser rods 143 and 144. As the wafers 121 and 126 are pressed firmly to each other with the presser rods 143 and 144, the wafers 121 and 126 start joining from the central portions thereof and the joined area expands toward the peripheries thereof to form a laminated wafer 127.

Figure 10:
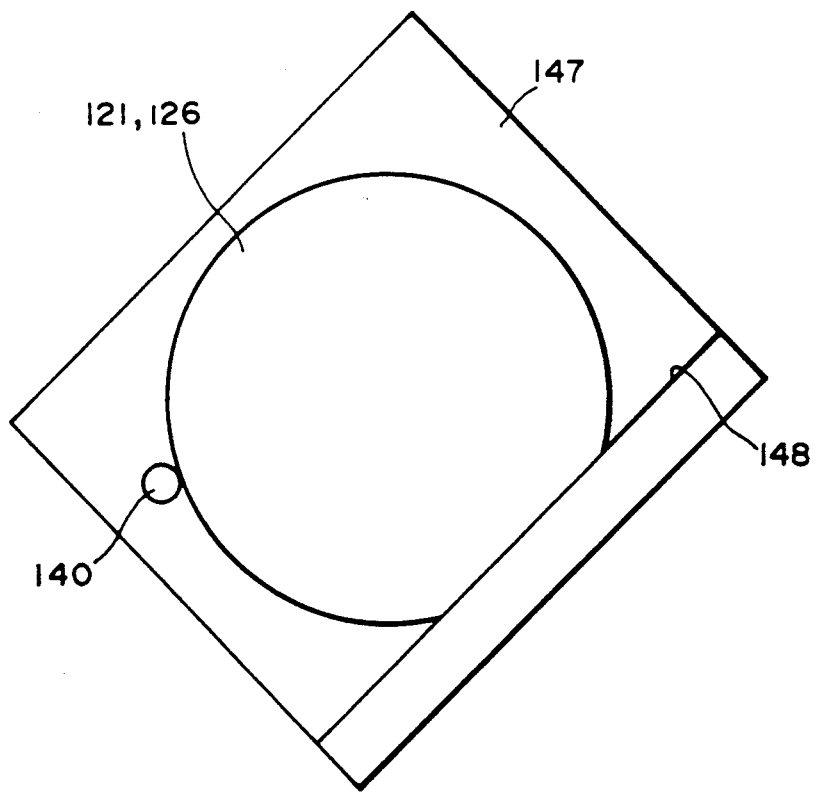
FIG. 10 is a plan view of a further laminating jig.

The assembling jig 149 shown in FIG. 9 comprises a block having an inclined surface 147 provided with a protrusion 146, and a bottom surface 148 extending perpendicularly to the inclined surface 147, a positioning pin 140 for positioning the wafers 121 and 126 relative to the protrusion 146, and a presser rod 150. In affixing the wafers 121 and 126 to each other to obtain a laminated wafer 127 by using the assembling jig 149, the wafers 121 and 126 are set against the inclined surface 147 as shown in FIG. 9, and then the wafers 121 and 126 are pressed against the protrusion 146 with the presser rod 150 extended opposite to the protrusion 148. The assembling jig 149 is disposed slightly obliquely as shown in FIG. 10 in affixing the wafers 121 and 126 to each other so that the wafers 121 and 126 rest on both the bottom surface 148 and the positioning pin 140 for positioning relative to the protrusion 146. The assembling jig 145 of FIG. 8 may be provided such a positioning pin.

Figure 12:
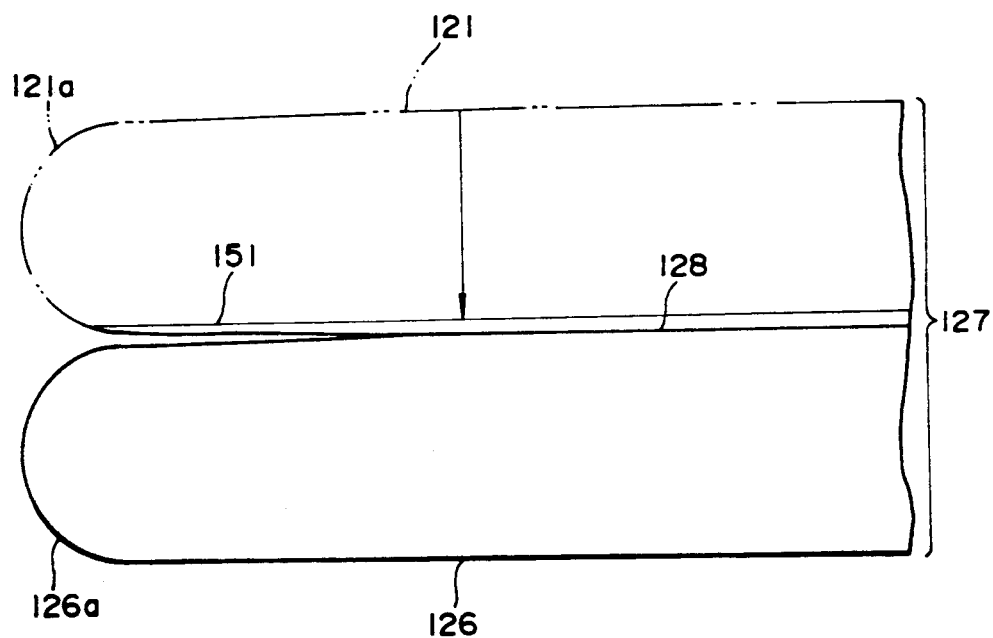
FIG. 12 is an illustration of assistance in explaining a grinding operation.

Then, the edges 121a and 126a of the laminated wafer 127 are ground. First, the edge 121a of the wafer 121 is ground deep as shown in FIG. 12 with a rough grinding stone, while a portion of the boundary surface of the wafer 126 near the edge 126a of the same is ground slightly. Then, the laminated wafer 127 is subjected to an etching process to remove the surface layer damaged by grinding from the ground surfaces and to remove strain. In grinding the wafer 121, the free major surface of the wafer 121 is ground in a circular arc. Ordinarily, the peripheral portion of the wafer has a cross section of the shape of a circular arc, the edge 121a of the wafer 121 separates from the other wafer 126 when the wafer 121 is ground deep near to the boundary surface corresponding to the interface 128, and the very thin remaining portion 151 of the wafer 21 is liable to be broken. If the remaining portion 151 is broken, fractions of the remaining portion 151, i.e., dust, reduces the yield of the semiconductor memory manufacturing process.

The foregoing grinding of the laminated wafer 127 eliminates the above problem.

Then, the thickness of the wafer 121 is reduced to a thickness on the order of 10 $\mu$m by precision lapping using a precision lapping machine.

Figure 3A:
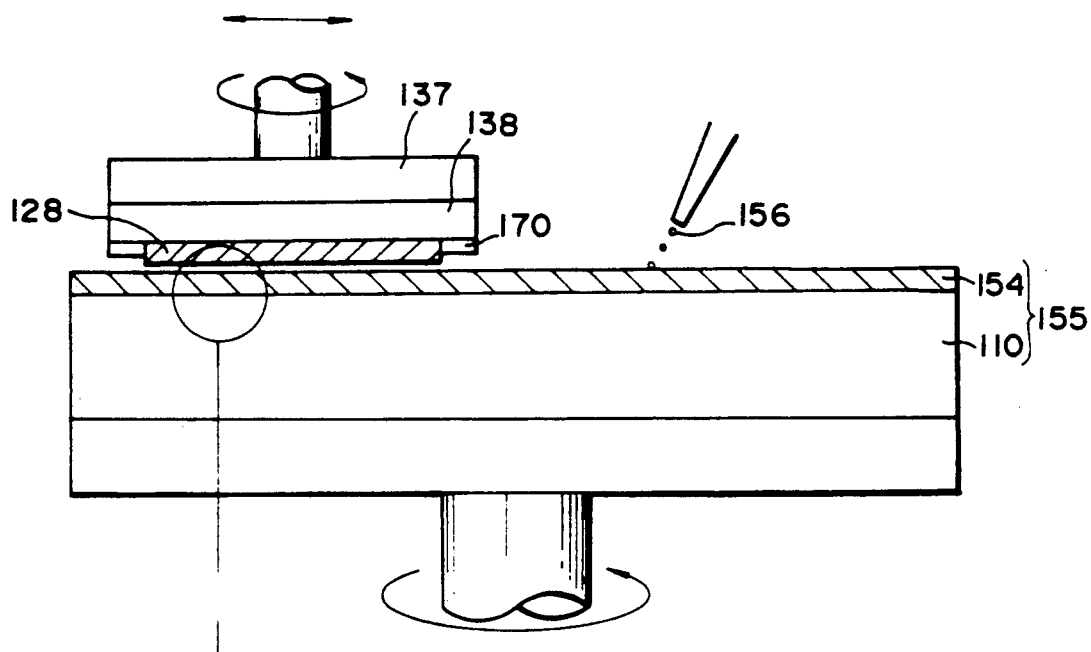
FIG. 3a-b are illustrations of assistance in explaining a lapping process included in a method of manufacturing a semiconductor memory in accordance with the present invention.
Figure 3B:
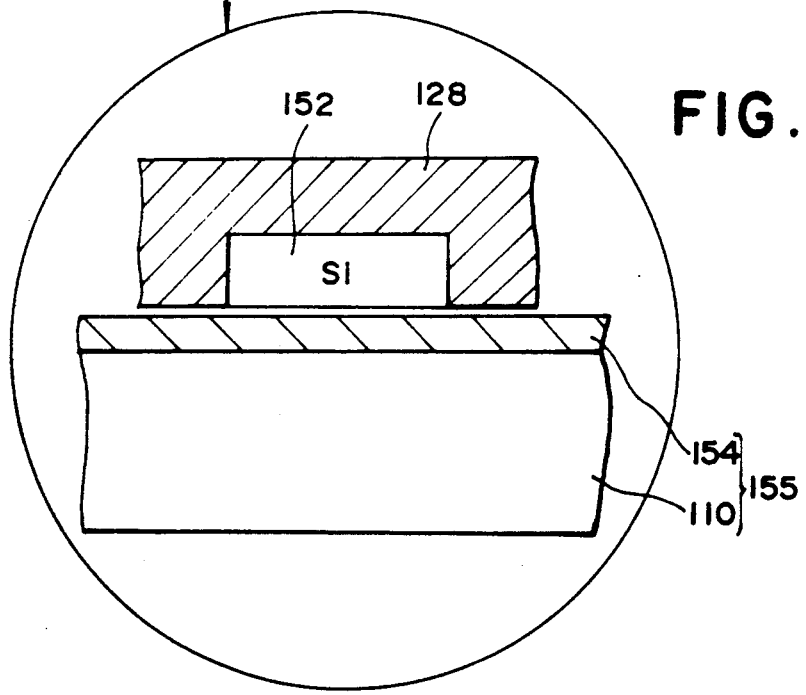

The selective lapping in Step J employs a lapping disk 155 as shown in FIG. 3. The lapping disk 155 is formed by applying a hard lapping pad 154, such as a polyester nonwoven fabric impregnated with polyurethane, or a porous polyurethane sheet of a rubber hardness in the range of 75 to 95, to a rigid disk 110. Only an alkaline solution, such as an aqueous ethylenediamine solution or an aqueous potassium hydroxide solution, is used as a lapping liquid 156. In the lapping operation, the lapping disk 155 is pressed against the surface of the wafer 121 to be lapped at a pressure in the range of 50 to 250 g/cm$^2$, the lapping disk 155 is rotated at a circumferential speed in the range of 20 to 80 m/min, the lapping liquid 156 is supplied at a supply rate in the range of 5 to 180 cm$^3$/min, and the wafer holder is rotated or reciprocated. Thus, a SOI substrate 153 having thin insular silicon layers 152 having a uniform thickness is obtained.

Figure 4A:
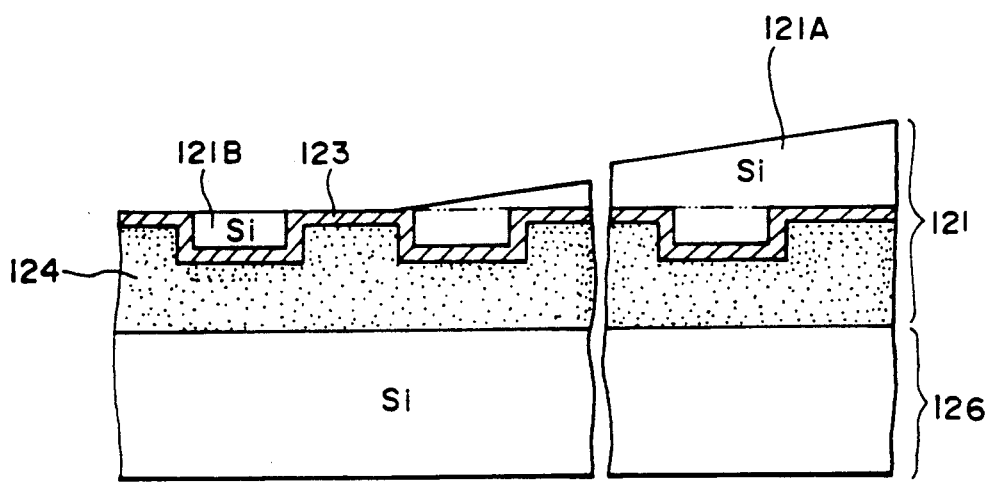
FIGS. 4(A) and 4(B) are illustrations of assistance in explaining a selective lapping process in accordance with the present invention.
Figure 4B:
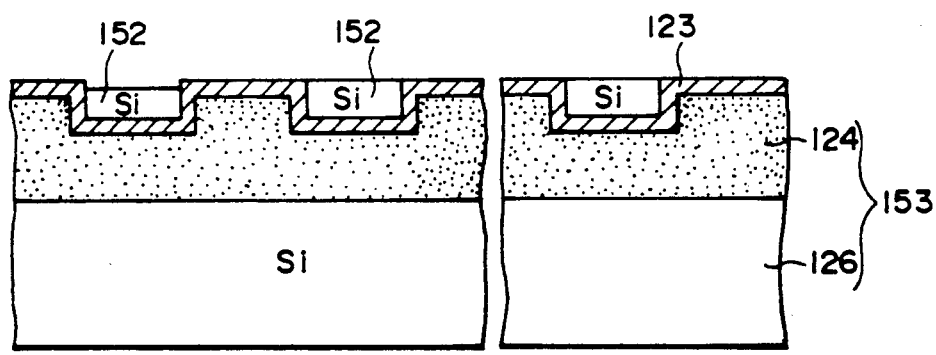

A selective lapping process shown in FIGS. 49A) and 4(B) included in the method of manufacturing a semiconductor memory in accordance with the present invention carries out the lapping operation in conformity to the above lapping conditions by using the lapping disk 155 provided with the hard pad 154. Accordingly, the lapping rate ratio, namely, the ratio of lapping rate for lapping portions of the semiconductor layer corresponding to portions of the insulating layer 123 (SiO$_2$ layer) other than those forming the recesses to lapping rate for lapping portions of the semiconductor layer corresponding to portions of the insulating layer 123 forming the recesses, is not less than fifty (FIG. 4(B)), and hence, after a portion of the insulating layer 123 formed on the wafer 121 has been exposed as shown in FIG. 4(A), the lapping rate for a semiconductor layer 121B formed in the recess in the exposed portion of the insulating layer 123 drops suddenly, and then the semiconductor layer 121A remaining over the insulating layer 123 is removed completely by lapping while the exposed semiconductor layer 121B in the recess is lapped slightly. Thus, the surfaces of insular semiconductor layers 152 formed in the recesses are finished flush with the surface of the insulating layer 123 as shown in FIG. 4(B).

Figure 5:
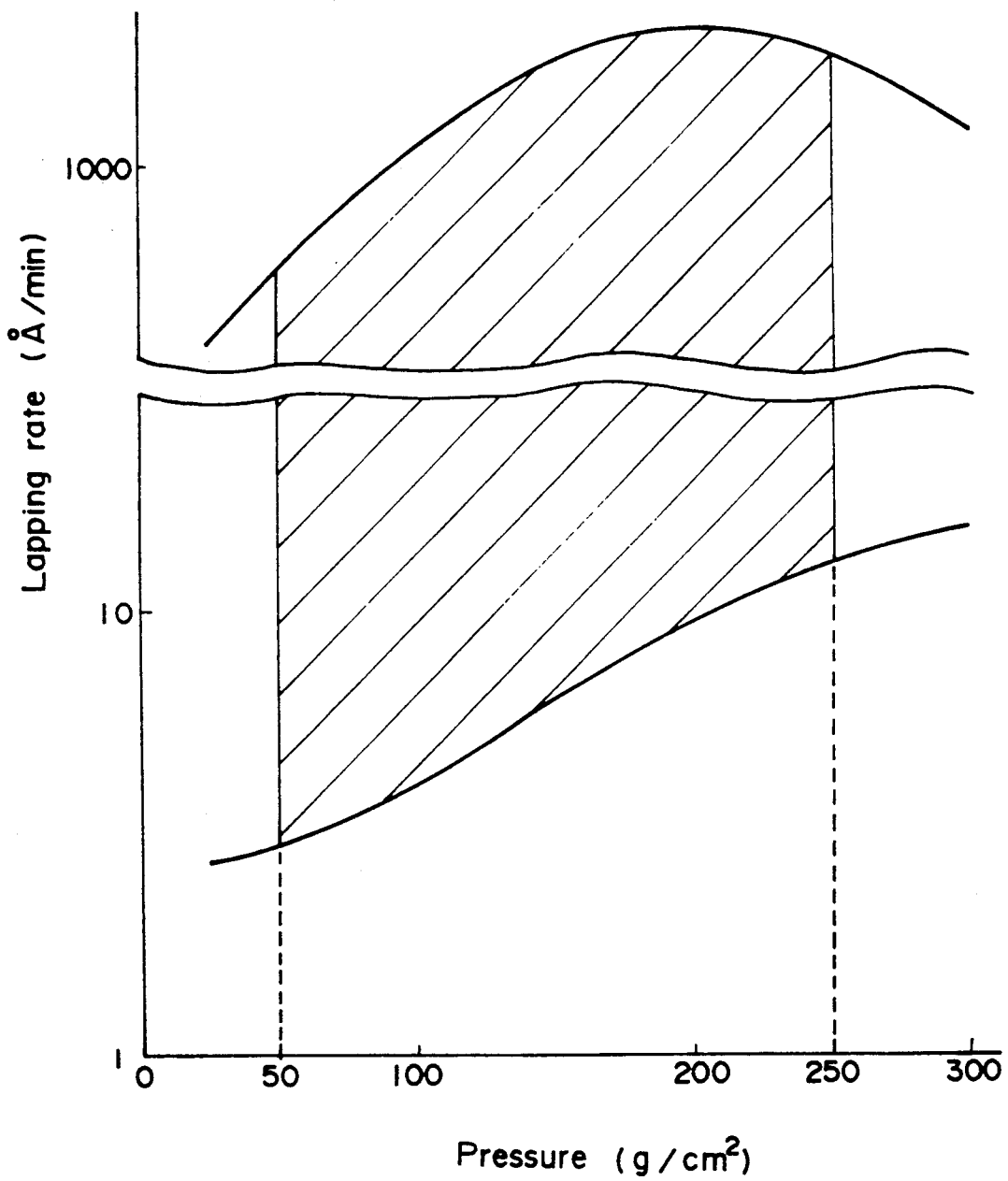
FIG. 5 is a graph showing the variation of lapping rate with lapping pressure in the lapping process in accordance with the present invention.
Figure 6:
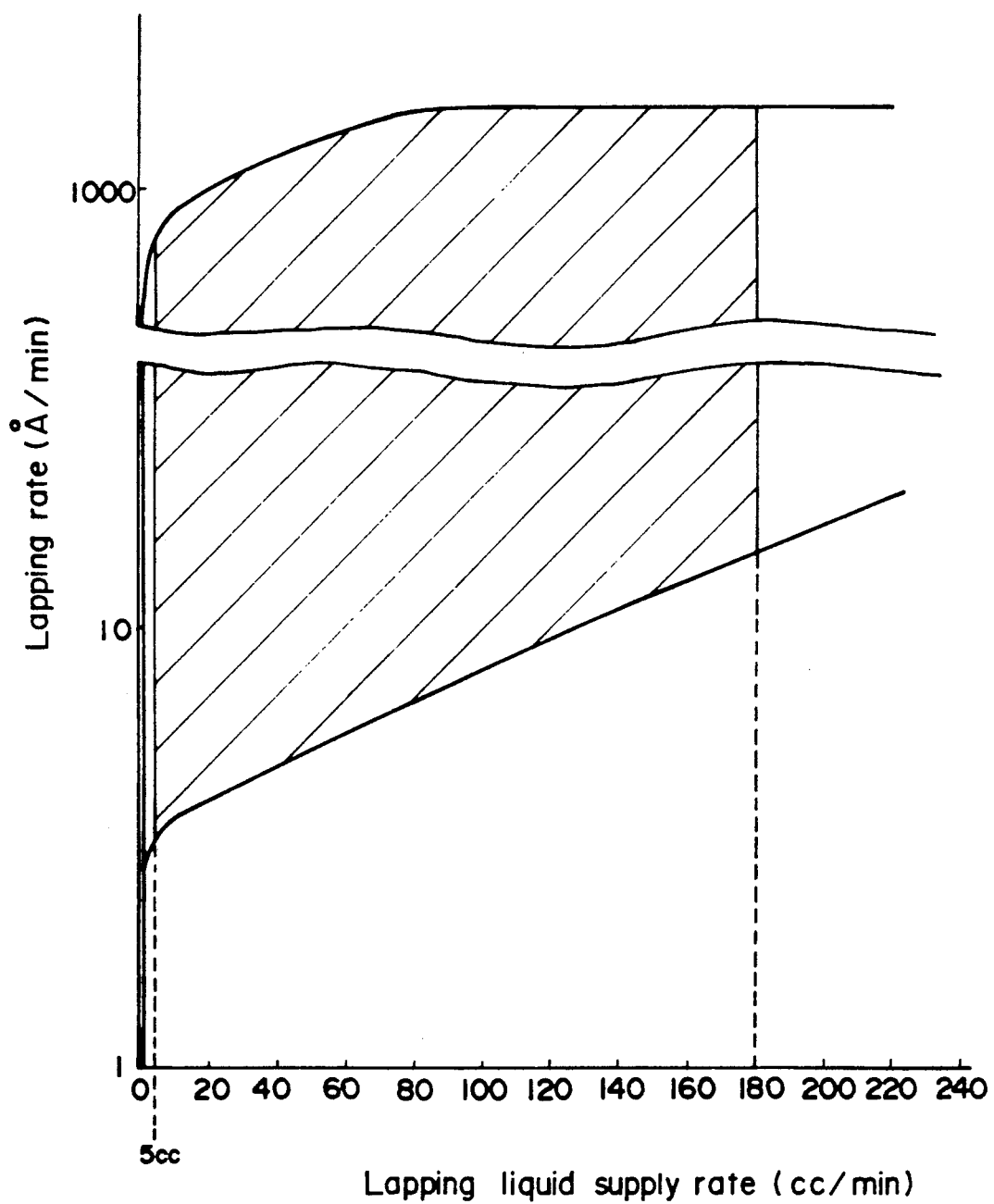
FIG. 6 is a graph showing the variation of lapping rate with lapping liquid supply rate.

FIG. 5 is a graph showing the variation of lapping rate for lapping portions of the semiconductor layer corresponding to portions of the insulating layer 123 other than those forming the recesses with pressure applied to the lapping disk, and the variation of lapping rate for lapping portions of the semiconductor layer corresponding to portions of the insulating layer forming the recesses with pressure applied to the lapping disk. FIG. 6 is a graph showing the variation of lapping rate for lapping portions of the semiconductor layer corresponding to portions of the insulating layer 123 other than those forming the recesses with lapping liquid supply rate, and the variation of lapping rate for lapping portions of the semiconductor layer corresponding to portions of the insulating layer 123 forming the recesses with lapping liquid supply rate.

As is evident from FIGS. 5 and 6, the lapping rate ratio is large and stable lapping can be achieved when the pressure applied to the lapping disk is in the range of 50 to 250 g/cm$^2$, and the lapping liquid supply rate is in the range of 5 to 180 cm$^3$/min.

The mechanism of the selective lapping in the semiconductor memory manufacturing method of the present invention is explained hereinafter.

The lapping liquid, such as an aqueous amine solution, does not react on the SiO$_2$ layer (insulating layer) and reacts on the silicon layer (semiconductor layer) to form a film of a reaction product. If the film of the reaction product is not removed, the lapping action is stopped. In the selective lapping, the film of the reaction product is removed continuously by the hard pad 154 to continue lapping the silicon layer. As the lapping operation is continued, the surface of the silicon layer sinks to a level below a plane including the surface of the SiO$_2$ layer. Consequently, the film of the reaction product formed over the silicon layer is not removed any longer, and hence the lapping of the silicon layer stops substantially when the surface of the silicon layer sinks to a level coinciding with the plane including the surface of the SiO$_2$ layer and the surface of the silicon layer is finished flat and flush with that of the SiO$_2$ layer. Thus, in the selective lapping process of the present invention, the lapping rate ratio increases sharply after the surface of the portion of the semiconductor layer corresponding to the portion of the insulating layer forming the recess has coincided with the plane including the surface of the insulating layer, so that the thin insular semiconductor layers 152 having excellent flatness are finished in a uniform thickness with their surfaces flush with the surface of the insulating layer and without any damage therein.

Since the lapping rate ratio is large, all the portions of the silicon layer corresponding to the portions of the SiO$_2$ layer other than those of the same forming the recesses are removed before the SiO$_2$ layer serving as a lapping stopper is abraded. The lapping rate for lapping the silicon wafer 121 is not less than 0.05 μm/min and hence the SOI substrate 153 can be produced at a high production rate. Since the lapping liquid is inexpensive and the lapping process does not use any abrasive grains, the silicon wafer 121 can be lapped at a reduced cost.

Incidentally, when the wafer 121 was lapped with the lapping disk 155 provided with the hard pad 154 by using an aqueous ethylenediamine solution containing abrasive grains, the insular silicon layers 121B formed in the recesses formed in the SiO$_2$ layer and the SiO$_2$ serving as a lapping stopper were abraded by the abrasive grains to deteriorate the flatness of the surface of the insular silicon layers 121B. Accordingly, it is most desirable to lap the silicon wafer 121 by using only an aqueous ethylenediamine solution or an aqueous potassium hydroxide.

TABLE 1

|  | Present invention | | | Conventional | | |
| --- | --- | --- | --- | --- | --- | --- |
|  | Ceramic disk | Soft pad | Hard pad | Ceramic disk | Soft pad | Hard pad |
| Lapping rate | High | Low | High | High | High | High |
| Abrasion of SiO$_2$ | Abraded | No | No | Abraded | Abraded | Abraded |
| Damages in SiO$_2$ | Damaged | No | No | Damaged | No | No |
| Flatness | Good | Bad | Good | Good | Bad | Bad |
| Lapping solution | Diamine solution | | | Diamine solution + Abrasive | | |

Results of lapping operation by the lapping process of the present invention and those of lapping operation by the conventional lapping process are tabulated in Table 1.

The selective lapping process in accordance with the present invention is able to lap the silicon layer to form satisfactory insular silicon layers in the recesses even if the width of the recesses is 100 μm or less, whereas the conventional lapping process using a lapping pad scrapes our silicon layers formed in the recesses and is unable to form insular silicon layers in the recesses when the width of the recesses is 10 μm or less.

In affixing the wafers 121 and 126 to each other in Step H as shown in FIG. 2(H), the assembling jig 145 or 149 is used. The same pressures are applied in opposite directions to the central portions of the wafers 121 and 126 with the presser rods 143 and 144 or with the presser rod 150 and the protrusion 146, respectively. Consequently, the wafers 121 and 126 start joining from the central portions thereof and the joined area expands toward the periphery and, finally, the wafers 121 and 126 are affixed firmly to each other to construct the laminated wafer 127, which is scarcely warped (the warp is 3.7 μm at the maximum) as indicated by contour lines in FIG. 11. The step between the adjacent contour lines is 0.50 μm. No bubble attributable to a stress induced by warping in the laminated wafer 127 is formed in the interface 128 between the wafers 121 and 126. Although pressures are applied in opposite directions to the central portions of the wafers 121 and 126 in affixing the wafers 121 and 126 to each other in this embodiment, the pressures may be applied to optional portions of the wafers 121 and 126.

Reasons for mirror-finishing the contact surfaces of the wafers 1 and 17 in an average roughness of 10 Å or below before affixing the wafers 1 and 17 to each other in Step H (FIG. 2(H)) will be described hereinafter.

Generally, it is considered that an optimum average roughness Ra of the surfaces of silicon wafers for semiconductor devices is in the range of 15 to 20 Å. If the average roughness Ra is 30 Å or greater, the wafers are unable to adhere to each other or, even if the wafers could adhere to each other, large bubbles are formed in the interface between the contact surfaces of the wafers.

It is known generally that bubbles are formed scarcely when the average roughness is in the range of 15 to 20 Å.

Experimental studies made by the inventors of the present invention to determine the upper limit of average roughness below which no bubble is formed will be described hereinafter.

The surfaces of wafers were lapped by a mechanical-and-chemical process to prepare sample wafers having different average roughnesses. The surface roughnesses of the mechanically and chemically lapped sample wafers were measured by a laser surface roughness tester having a resolution of 3 Å after cleaning the same by a washing process. The sample wafers having substantially the same surface roughness were attached to each other. The surfaces of the sample wafers were cleaned by a cleaning liquid, namely, a mixture of ammonia and hydrogen peroxide, before attaching the sample wafers to each other, and then the sample wafers were attached to each other in a clean atmosphere after drying the same to obtain sample laminated wafers. The sample laminated wafers were subjected to a heat treatment at 1100° C. in a nitrogen atmosphere, and then the sample laminated wafers were examined to see if any bubbles are formed in the sample laminated wafers.

Figure 13:
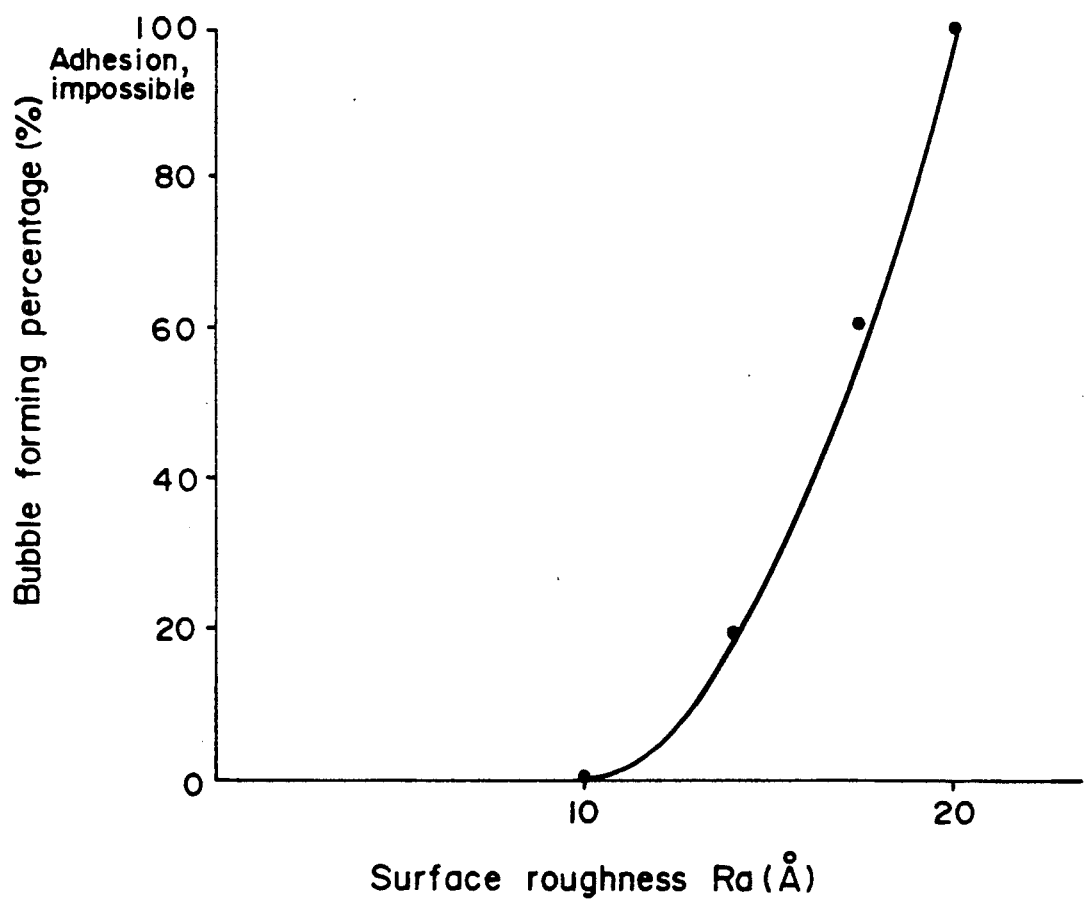
FIG. 13 is a graph showing the relation between surface roughness and bubble forming percentage.

The results of the experimental studies are shown in FIG. 13, in which bubble forming percentage is measured on the vertical axis, and average roughness Ra is measured on the horizontal axis. Bubble forming ratio is defined by {(Area of bubbles)/(Surface area of laminated wafer)} × 100 (%)

As is evident from FIG. 13, no bubble is formed when the average roughness Ra is not more than 10 Å.

Thus, the wafers 121 and 126 can be perfectly affixed closely to each other without warping the wafers 121 and 126 and without forming any bubbles therebetween by using the assembling jig 145 (FIG. 8) or 149 (FIG. 9) when the average roughnesses of the wafers 121 and 126 are not more than 10 Å.

The process for forming the polycrystalline layer 2 over the surface of the $SiO_2$ layer 3 in Step G (FIG. 2(G)) is carried out at a comparatively low growing temperature in the range of about 500 to about 950° C. (in this embodiment, about 600°0 C.). Therefore, silicon crystal grains are formed apparently uniformly over the surface of the $SiO_2$ layer 3 at a comparatively low growth rate, and hence a large amount of silicon crystal grains are formed. Consequently, the polycrystalline silicon layer 2 is formed uniformly by minute silicon crystal grains without entailing the abnormal local growth of acicular crystals, namely, silicon whiskers having a length several to several tens times a desired film thickness of about 5 μm, which is liable to occur when the polycrystalline silicon layer 2 is formed at a high growing temperature in the range of 100 to 1150° C. Such acicular crystals fall off in the subsequent lapping process and thereby pinholes are formed in the polycrystalline silicon layer 2. Thus, the polycrystalline silicon layer 2 formed by the method of the present invention has uniform quality and no pinhole, and hence the wafers thus formed can be attached to each other without forming any bubbles in the interface therebetween. Accordingly, the laminated wafer thus formed are not destructed due to the expansion of the bubbles in heat treatment processes in manufacturing semiconductor devices and hence the contamination of a furnace for the heat treatment of the wafers by the fractions of broken wafers will not occur.

Figure 7:
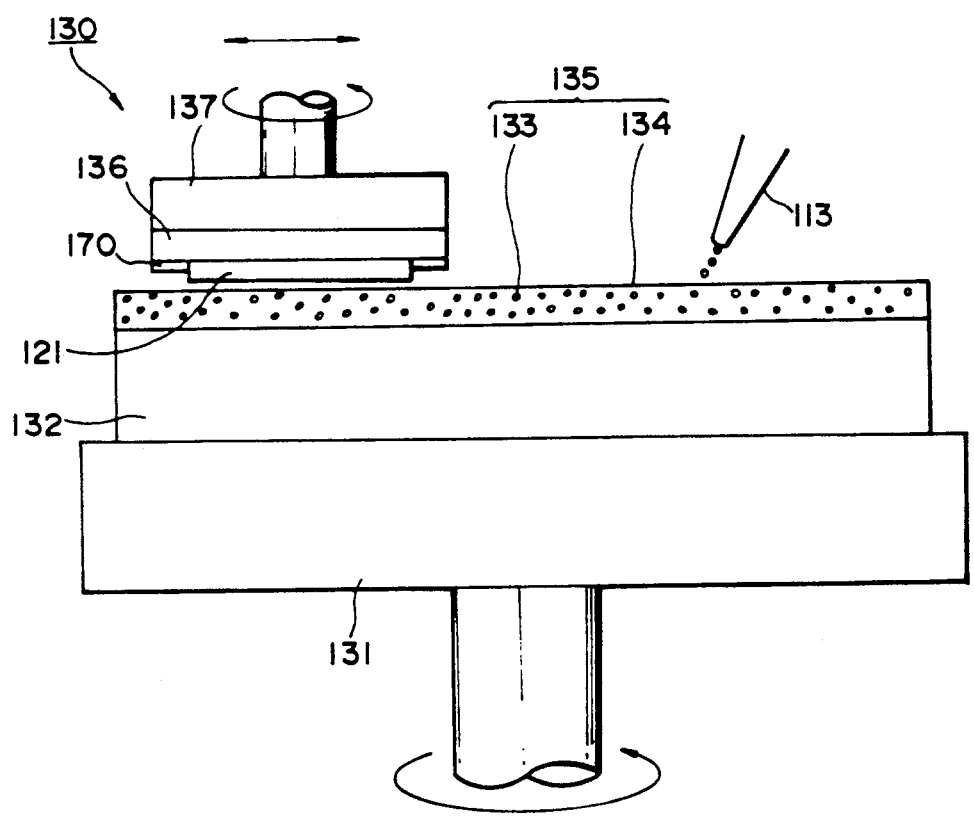
FIG. 7 is a schematic front elevation of a lapping machine employed in carrying out the method of manufacturing a semiconductor memory in accordance with the present invention.
Figure 8:
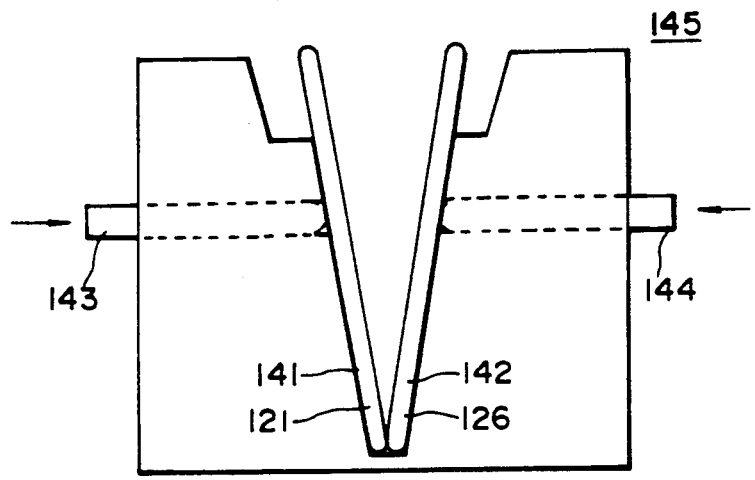
FIGS. 8 and 9 are schematic side elevations of laminating jigs, respectively, for laminating wafers.
Figure 11:
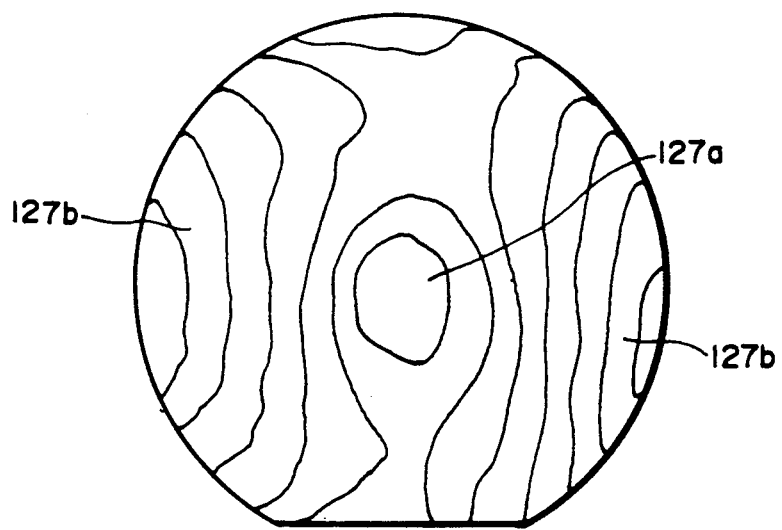
FIG. 11 is contour map of assistance in explaining the state of laminated wafers.

A lapping machine 130 as shown in FIG. 7 employing a lapping disk formed by attaching a soft pad 135 formed of a soft sheet 134 containing abrasive grains 133 to a rigid disk 132 is used in Step G (FIG. 2(G)) to lap the polycrystalline silicon layer 2. This lapping machine may be applied to the selective lapping of the first semiconductor substrate 17 in Step J (FIG. 2(J)), in which abrasive grains 133 having a hardness lower than that of silicon is used. Since the rigid disk 132 is rigid and the soft pad 135 consisting of the soft sheet 134 and the abrasive grains 133 is thin, the first semiconductor substrate 17 can be lapped flat by selective lapping, namely, the lapping action of the lapping disk is stopped by the surface of the insulating layer 3 ($SiO_2$ layer), to form the insular semiconductor regions 5 (silicon layers) in the recesses formed by the insulating layer 3 with their surfaces flat and flush with the surface of the insulating layer 3. Since the hardness of the abrasive grains 133 is lower than those of the first semiconductor layer 17 and the insulating layer 3, the surface of the SOI substrate 153, namely, the surfaces of the semiconductor regions 5 and that of the insulating layer 3, is not damaged by selective lapping. A wax may be used instead of the soft sheet 134. When a wax is used, the lapping disk can be readily prepared by applying the molten wax to the surface of the rigid disk 132, and the lapping disk can be readily reproduced by removing the wax by melting and applying the new wax again to the surface of the rigid disk 132.

Figure 15:
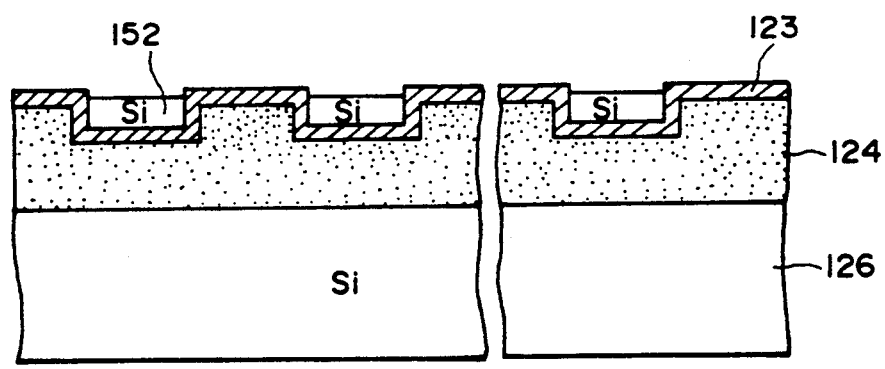
FIG. 15 is sectional view of a SOI substrate employed in manufacturing a semiconductor memory in another embodiment according to the present invention.
Figure 16A:
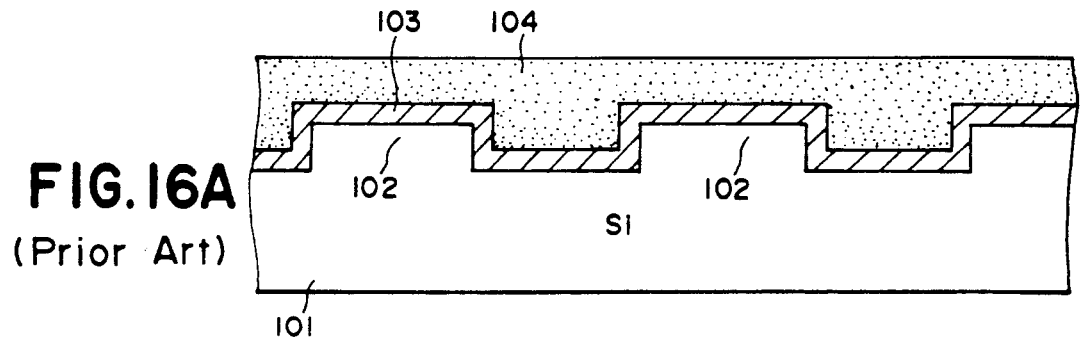
FIGS. 16(A) TO 16(C) are sectional views of assistance in explaining a conventional process of fabricating a SOI substrate.
Figure 16B:
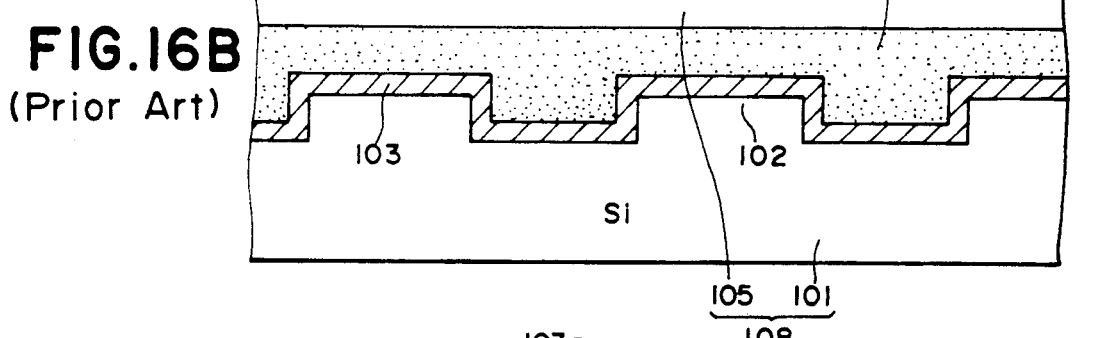
Figure 16C:
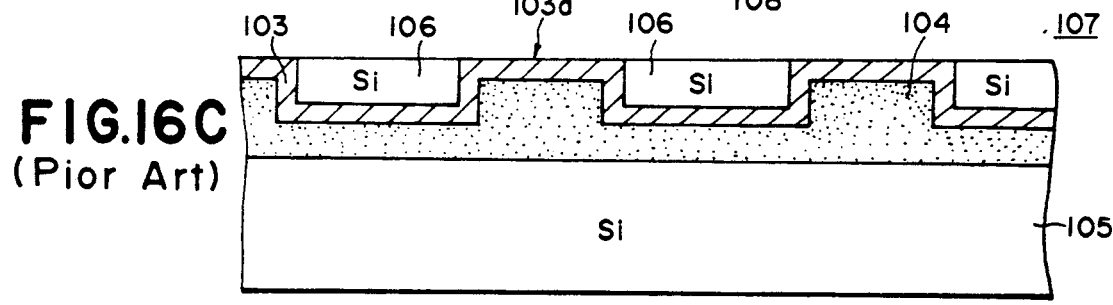
Figure 17:
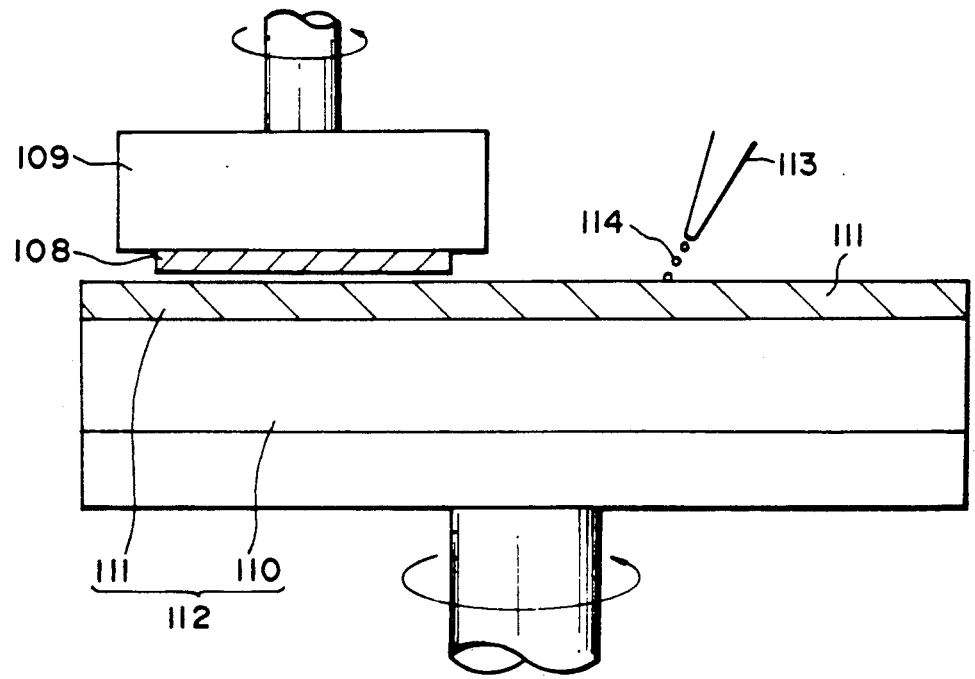
FIG. 17 is a schematic front elevation of a conventional lapping machine for selective lapping.
Figure 18:
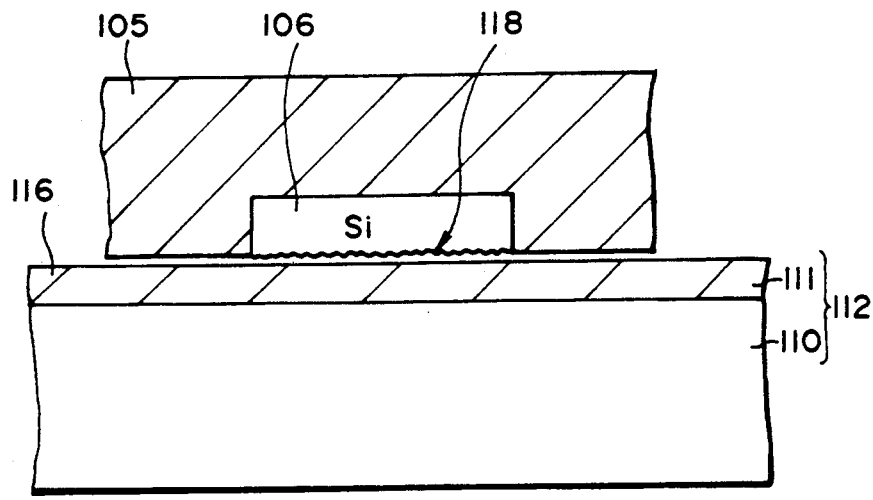
FIG. 18 is a sectional view of a conventional lapping disk in lapping operation.
Figure 19:
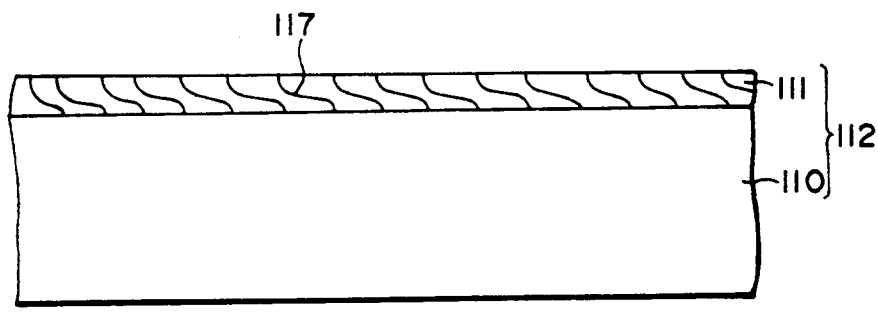
FIG. 19 is a sectional view of another conventional lapping disk.
Figure 20:
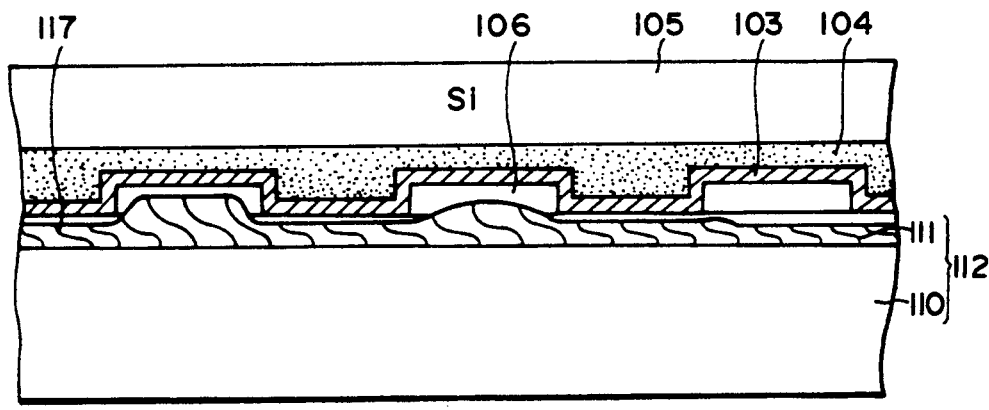
FIG. 20 is a sectional view of assistance in explaining the lapping action of the lapping disk of FIG. 19.

Although the selective lapping operation is stopped upon the exposure of all the portions of the $SiO_2$ layer other than those forming the bottoms of the recesses in the selective lapping process shown in FIGS. 4(A) and 4(B), the selective lapping operation may be continued further to lap the silicon layer 121 further until the surfaces of the insular silicon layers 152 sink below the surface of the $SiO_2$ layer 123 slightly by a depth on the order of 200 Å as shown in FIG. 15. Lapping the silicon layer 121 so that the surfaces of the insular silicon layers 152 sink below the surface of the $SiO_2$ forms all the insular silicon layers 152 in further uniform thickness, facilitates handing the SOI substrate 153 in forming semiconductor devices on the insular silicon layers 152 and reduces the possibility of damaging and contaminating the insular silicon layers 152 in handling the SOI substrate 153, and thereby the reliability of the semiconductor device is improved. When the insular silicon layers 152 are desired to be formed in an appropriate thickness, for example, about 1000 Å, with the surfaces thereof extending slightly below the surface of the $SiO_2$ layer 123, for example, by a depth of about 20 Å, the recesses may be formed in a depth of about 1200 Å.

A gettering process for gettering the insular silicon layers 152 in fabricating a semiconductor device employing the SOI substrate 153 will be described hereinafter with reference to FIG. 14.

Generally, a so-called IG process which forms a precipitated layer of oxygen within a substrate and makes the defects absorb metallic impurities or a so-called EG process which forms a damaged layer in the lower surface of a substrate by sand blasting or polycrystalline silicon layer on the lower surface of a substrate is applied practically as gettering means in directly forming semiconductor elements on a substrate to construct a semiconductor device. However, such conventional gettering means is not applicable to a semiconductor substrate of a SOI construction, such as the SOI substrate 153, having an insulating layer (the SiO$_2$ layer 123) formed under insular silicon layers (the insular silicon layers 152). Accordingly, metallic impurities remain unremoved in interfaces between the source and gate electrodes and between the gate and drain electrodes exerting adverse effects, such as increase in leakage current and reduction in the life of the semiconductor device, on the characteristics of the semiconductor device.

Figure 14:
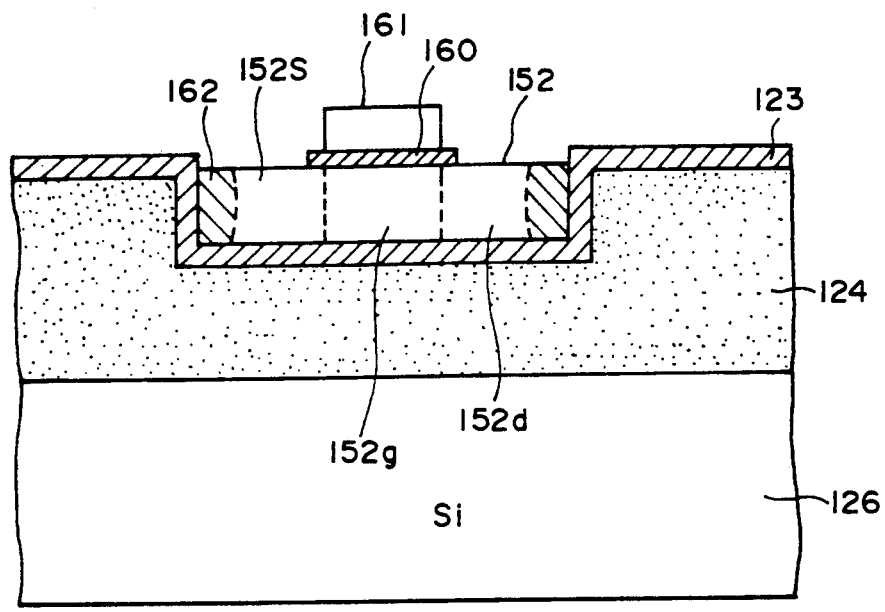
FIG. 14 is a sectional view of assistance in explaining a gettering process.

According to the present invention, to obviate such adverse effects of metallic impurities on the semiconductor device, a gate electrode 161 is formed on a gate oxide film 160 formed on the insular silicon layer 152, a source region 152s, a gate region 152g and a drain region 152d are formed in the insular silicon layer 152 as shown in FIG. 14, the outer portions of the source region 152s and the drain region 152d are doped by ion implanting with an electrically inert impurity, such as oxygen ions, in a doping density of $1 \times 10^{16}/cm^2$ as shown in FIG. 14, and then the SOI substrate 153 is heat-treated for getting in an oxygen atmosphere at 700° C. for one hour to form getter regions 162. The doping is successful only when lattice faults are formed in the crystals as a getter.

The getter regions 162 thus formed in the outer portions of the source region 152s and the drain region 152d by ion implanting absorb metallic impurities during the subsequent heat treatment in fabricating a semiconductor device, so that the current leakage in the semiconductor device is reduced and the life of the same is extended. The ion implanting process may be carried out before forming the gate electrode 161 or before forming the source region 152s and the drain region 152d. The getter regions 162 are effective also in fabricating a semiconductor device by using a substrate formed by the method of the present invention, a substrate formed by a SIMOX (separation by implanted oxygen) method or a substrate formed by an epitaxial growth method provided that the substrate is of a SOI construction. Naturally, the getter regions 162 can be effectively applied to a substrate having insular silicon layers formed flush with the surface of the insulating layer. The electrically inert impurity may be a substance other than oxygen, such as silicon, germanium, carbon, nitrogen or argon.

Although the invention has been described in its preferred forms with a certain degree of particularity, obviously, many changes and variations are possible therein. It is therefore to be understood that the present invention may be practiced otherwise than as specifically described herein without departing from the scope and spirit thereof.

What is claimed is:

1. A method of manufacturing semiconductor memory, comprising steps of:
    selectively removing portions of the surface of a first semiconductor substrate to form recesses and semiconductor lands on which MIS transistors are to be formed;
    forming an insulating layer over the surface of the first semiconductor substrate;
    forming contact holes through-the-insulating layer so as to reach the surfaces of the lands of the first semiconductor substrate, respectively;
    forming electrode layers on the insulating layer so as to connect with the surfaces of the lands of the first semiconductor substrate through the contact holes respectively;
    coating the electrode layers, respectively, with dielectric layers;
    forming a semiconductor layer over the insulating layer so as to cover the electrode layers coated with the dielectric layers;
    attaching a second semiconductor substrate to the semiconductor layer after flattening the contact surface of the semiconductor layer;
    removing the first semiconductor substrate leaving the lands of the same surrounded by the insulating layer as semiconductor regions; and
    forming the MIS transistors on the lands of the first semiconductor substrate remaining as the semiconductor regions.

2. A method of manufacturing a semiconductor memory according to claim 1, wherein the first semiconductor substrate is removed leaving the lands of the same surrounded by the insulating layer as semiconductor regions by a lapping process which employs an alkaline liquid as a lapping liquid, and the ratio of lapping rate for lapping portions of the first semiconductor substrate other than those of the same forming the lands to lapping rate for lapping the portions of the first semiconductor substrate forming the lands is not less than twenty.

* * * * *